United States Patent
Rioux et al.

(10) Patent No.: US 10,465,858 B2
(45) Date of Patent: Nov. 5, 2019

(54) LIGHT EMITTING DIODE TUBE LAMP INCLUDING GLASS LAMP TUBE WITH SELF DIFFUSIVE TUBE GLASS AND METHOD OF FORMING SELF DIFFUSIVE GLASS USING CHEMICAL ETCHING

(71) Applicants: Philip Rioux, Brentwood, NH (US); Shiyong Zhang, Boxborough, MA (US)

(72) Inventors: Philip Rioux, Brentwood, NH (US); Shiyong Zhang, Boxborough, MA (US)

(73) Assignee: LEDVANCE LLC, Wilmington, MA (US)

( * ) Notice: Subject to any disclaimer, the term of this patent is extended or adjusted under 35 U.S.C. 154(b) by 0 days.

(21) Appl. No.: 15/720,106

(22) Filed: Sep. 29, 2017

(65) Prior Publication Data
US 2019/0101268 A1  Apr. 4, 2019

(51) Int. Cl.
| | |
|---|---|
| *F21K 9/27* | (2016.01) |
| *F21V 3/04* | (2018.01) |
| *F21K 9/66* | (2016.01) |
| *F21Y 115/10* | (2016.01) |
| *F21K 9/90* | (2016.01) |
| *F21V 3/06* | (2018.01) |
| *F21Y 103/10* | (2016.01) |
| *H01L 33/50* | (2010.01) |

(52) U.S. Cl.
CPC .............. *F21K 9/27* (2016.08); *F21K 9/66* (2016.08); *F21K 9/90* (2013.01); *F21V 3/049* (2013.01); *F21V 3/061* (2018.02); *F21Y 2103/10* (2016.08); *F21Y 2115/10* (2016.08); *H01L 33/50* (2013.01)

(58) Field of Classification Search
None
See application file for complete search history.

(56) References Cited

U.S. PATENT DOCUMENTS

| | | | | |
|---|---|---|---|---|
| 5,952,784 | A * | 9/1999 | Witting | H01J 65/048 313/44 |
| 7,661,839 | B2 * | 2/2010 | Tsai | H01J 61/025 313/485 |
| D684,281 | S * | 6/2013 | Rioux | D26/2 |
| 2005/0248255 | A1 * | 11/2005 | Chen | A61L 2/088 313/493 |
| 2007/0057610 | A1 * | 3/2007 | Allen | H01J 61/34 313/17 |

\* cited by examiner

*Primary Examiner* — Ashok Patel
(74) *Attorney, Agent, or Firm* — Tutunjian & Bitetto, PC

(57) ABSTRACT

A method of lamp assembly that etching a glass tube body to increase a texture of the surface of the sidewall of the glass tube body, the sidewall of the glass tube body enclosing a hollow interior; and positioning a circuit board including a plurality of light emitting diodes (LEDs) within the hollow interior of the glass tube, wherein the increase in the texture of the surface increases the light diffusivity of the glass tube body.

7 Claims, 12 Drawing Sheets

LIGHT EMITTING DIODE TUBE LAMP INCLUDING GLASS LAMP TUBE WITH SELF DIFFUSIVE TUBE GLASS AND METHOD OF FORMING SELF DIFFUSIVE GLASS USING CHEMICAL ETCHING

TECHNICAL FIELD

The present disclosure generally relates to lighting, and more particularly to lamp tubes used with light sources including light emitting diodes (LEDs).

BACKGROUND

Fluorescent light fixtures have been a popular form of lighting for many decades. A fluorescent lighting fixture includes one or more fluorescent tubes, with each tube having an end cap on each end of a tube. Lighting systems based on LED light sources are a fairly new technology in the lighting field. LED's are desirable because they have a longer life, and they use less power than fluorescent tubes of equivalent output.

SUMMARY

In one aspect, a lamp tube is provided for lamps, such as lamps including light sources including light emitting diodes (LEDs), in which the exterior surface of the lamp tube's glass sidewall has been etched, i.e., chemically etched, to increase the exterior surfaces roughness, which increases the light diffusivity of the glass lamp tube. In one embodiment, the lamp tube includes a glass tube body having a perimeter defined by a sidewall of the glass tube body for enclosing a hollow interior. The exterior surface and the interior surface of the sidewall is textured to increase light diffusivity. In one embodiment, the exterior surface has a first roughness substantially equal to the texture on the interior surface having a second roughness.

In another aspect, a lamp is provided that includes a glass tube body having a glass sidewall that has been etched, i.e., chemically etched, to increase the surface roughness of the exterior surface of the glass sidewall, which increases the light diffusivity of the glass lamp tube. In one embodiment, the lamp includes a glass tube body having a perimeter defined by a sidewall of the glass tube body for enclosing a hollow interior. The exterior surface and the interior surface of the sidewall are textured to increase light diffusivity. In one embodiment, the texture on the exterior surface of the glass sidewall has a first roughness comparable to the texture on the interior surface having a second roughness. The lamp further includes at least one light emitting diode (LED) on a substrate that provides the light source. The at least one light emitting diode (LED) that is present on the substrate is positioned within the hollow interior of the glass tube body.

In another aspect, a method of forming a lamp is provided that includes a glass tube body having a glass sidewall that has been etched to increase the surface roughness of the exterior surface of the glass sidewall. In one embodiment, the method of lamp assembly includes etching a glass tube body to increase a texture of a surface of the sidewall of the glass tube body, in which the sidewall of the glass tube body enclosing a hollow interior. In one embodiment, the lamp assembly method can further include positioning a circuit board including a plurality of light emitting diodes within the hollow interior of the glass tube. The increase in the texture of the exterior surface increases the light diffusivity of the glass tube body.

BRIEF DESCRIPTION OF THE DRAWINGS

The following description will provide details of embodiments with reference to the following figures wherein.

DETAILED DESCRIPTION

Figure 1:
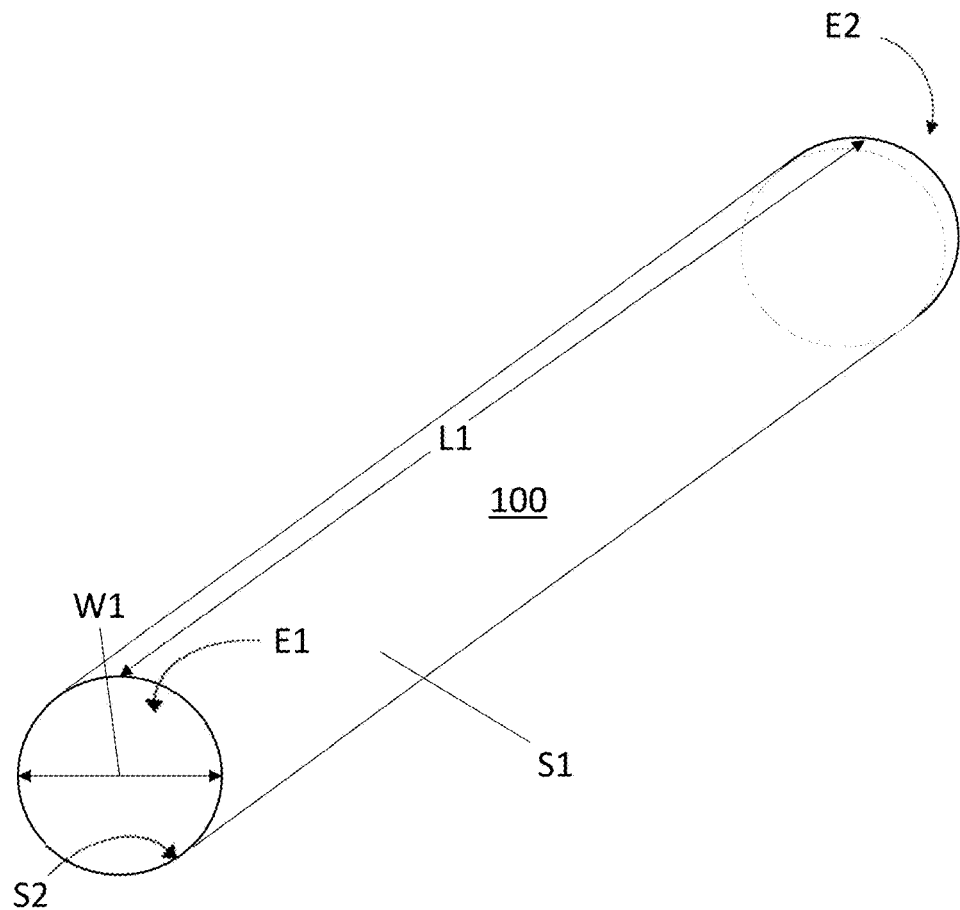
FIG. 1 is a perspective view of a glass tube body, in which the exterior surface of the lamp tube's glass sidewall has been etched, i.e., chemically etched, to increase the exterior surface roughness, i.e. texture, which increases the light diffusivity of the glass lamp tube, in accordance with one embodiment of the present disclosure.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

As light emitting diode (LED) light sources become a more attractive solution to lighting in fluorescent type lighting fixtures, glass tubes have been considered for tube lighting employing light emitting diodes (LEDs). It has been determined that because individual LEDs emit light as point light sources, and light from those point light sources is not diffused, the effect of optical glare in tube lamps composed of glass, i.e., a lamp having a glass tube body, can be disadvantageously strong. When a string of a plurality of light emitting diodes (LEDs) is employed as the light source positioned within the hollow interior of a glass tube body, which typically has insufficient light diffusivity performance for light emitting diode (LED) lighting, each of the individual LEDs can be seen when the lamp is illuminated. This may be referred to as "hot spot patterning". The visual identification of the individual LEDs is not preferred. A lamp illuminating light uniformly along its length in a manner that represents a singular consistent light source is preferred to the non-uniform perception of lighting from the individual LEDs in a tube lamp having insufficient light diffusivity performance.

In some examples, diffusive coatings have been applied to glass tube bodies to increase the light diffusivity. The diffusive coatings can be applied to the interior sidewalls of the glass tube body. The difficulty with diffusive coatings, is the need for a scratch tolerant coating, and coatings using traditional phosphor coating process are not scratch tolerant. These types of coatings do not have the scratch tolerance to withstand the assembly process for forming LED lighting using tube lamp bodies, in which a printed circuit board that provides the substrate for the individual LEDs is inserted, into the hollow interior of the tube lamp body i.e., inserting by sliding in contact with sidewalk of the glass tube body. It has been determined that the scratch tolerant coatings have higher optical loss. In other examples, a diffusive plastic sheath can be attached onto the outside of glass tube body. The diffusive sheath can be applied to the exterior side of the glass tube body by using insert-and-shrink process. As the sheath is thin, there exist high risks of being scratched or even damaged due to material handling at manufacturing, transportation or installation. Additionally, "hot spot pattern" may still be an issue with diffusive sheath applications due to non-uniform diffusing if the sheathes are unevenly stretched. Additionally, the plastic sheath may have aging and yellowing problems when exposed to UV and blue light during the life time.

In some embodiments, the methods, structures and assemblies described herein can overcome the aforementioned disadvantages by providing a light emitting diode (LED) tube lamp composed of a self-diffusive tubular glass. In some embodiments, the self-diffusive tubular glass does not include diffusive coatings, and does not include a diffusive sheath. The self-diffusive glass tube body that is employed by the methods, structures and assemblies described herein has a textured exterior surface provided by etching, i.e., chemically etching, the surface of the glass sidewall of the glass tube body, in which the textured exterior surface increases the light diffusivity performance of the glass tube body. The textured exterior surface of the sidewall of the glass tube body contributes to more uniform light diffusion for the light emitted from the plurality of light emitting diodes (LEDs) that are present in the hollow interior of the glass tube body in the lamp assembly. Further, because the high diffusive tubular glass provided by the etch process, i.e., chemical etch process, applied to the glass tube body increases the light diffusivity of the glass, interior diffusivity coatings, and exterior diffusive plastic sheaths are not needed, and hence eliminated. This provides for a more relaxed manufacturing process. In some embodiments, the self-diffusive glass tube body provides an interior sidewall surface that is scratch resistant, i.e., sufficient for light emitting diode (LED) board mounting. In some embodiments, the self-diffusive glass tube body provides for an exterior sidewall surface that is also scratch resistant, which is advantageous for manufacturing, transportation, as well as handing during installation. The methods, structures and assemblies of the present disclosure are now described with further detail with reference to FIGS. 1-15.

FIGS. 1-4 depict one embodiment of a lamp tube including a glass tube body 100 having a perimeter defined by a sidewall of the glass tube body 100 for enclosing a hollow interior, in which the exterior surface S1 of the sidewall and the interior surface S2 of the glass sidewall for the glass tube body 100 is textured. The texture on exterior surface S1 of the glass sidewall has a first roughness comparable to, e.g., close to, the texture on the interior surface S2 of the glass sidewall having a second roughness.

Figure 3:
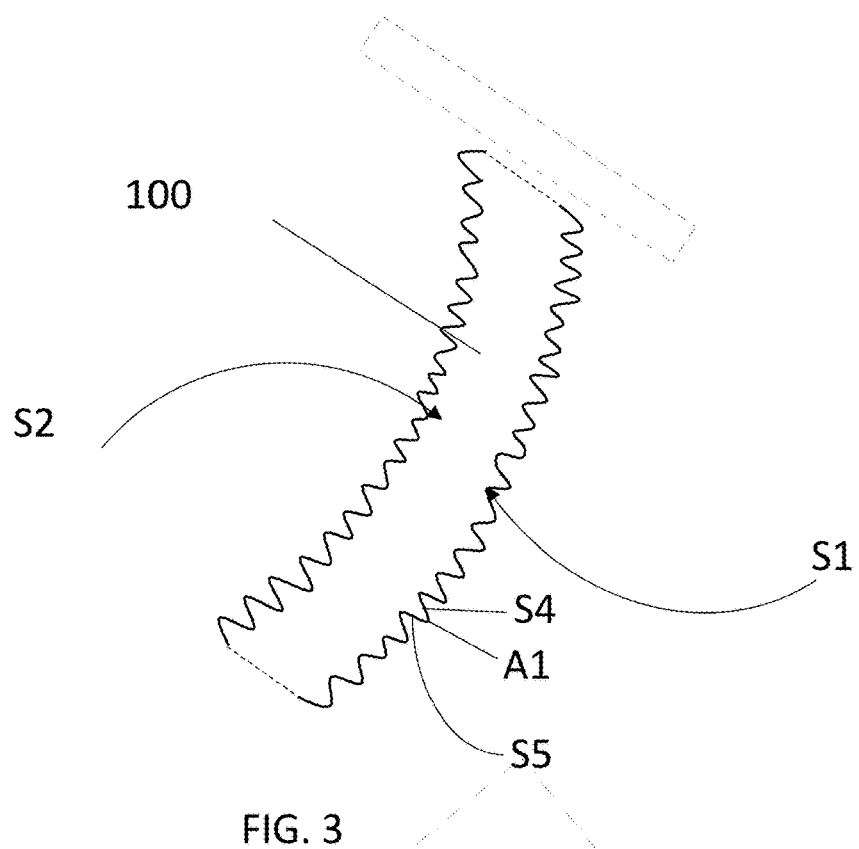
FIG. 3 is a magnified view of a portion of a glass tube body sidewall depicted in FIG. 2 depicting one embodiment of an etched glass sidewall, in which the texture is provided by features with a geometry of a plurality of scallops, in accordance with the present disclosure.
Figure 4:
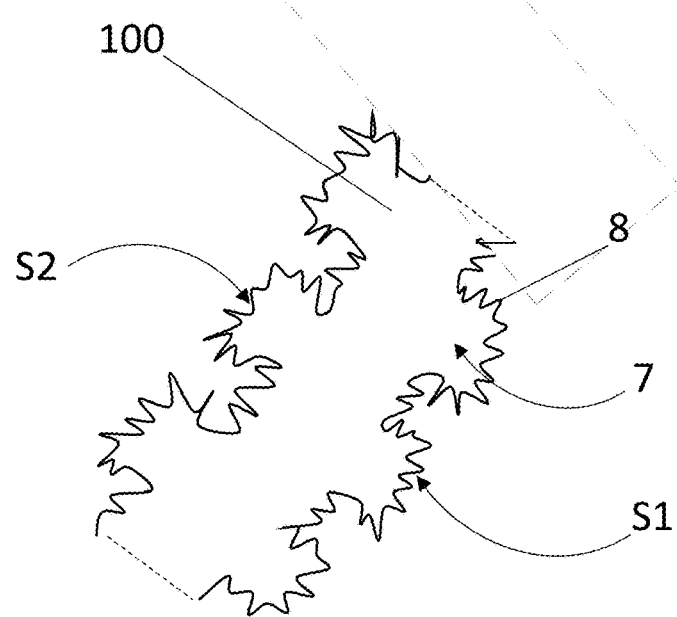
FIG. 4 is a magnified view of a portion of a glass tube body sidewall depicted in FIG. 2 depicting another embodiment of an etched glass sidewall, in which the texture is provided by features with a geometry of a plateaus including protrusions, in accordance with the present disclosure.

The texture having the roughness suitable for increasing light diffusivity of the glass tube body can be characterized as having contiguous areas of glass differentially recessed by chemical etching, e.g., having pits, or higher elevation domains, e.g., mounds, plateaus, or "lands". In some embodiments, the texture provided by the chemical etching of the glass sidewall may be characterized as including a plurality of scallops defined by a peaked upper surface and tapered sidewalls extending to a base having a greater width than the peaked upper surface of the scallops, as depicted in FIG. 3. In some other embodiments, the texture provided by the chemical etching of the glass sidewall may be characterized as including a plurality of plateaus each including surface projections having an inverted v-shaped side cross-sectional geometry, the upper surface of the projection provided by the apex of the inverted v-shape, as depicted in FIG. 4. As will be further described below the chemical etch process may also form micro-pores in the glass sidewall of the glass tube body.

The texture provided by the roughness produced by the chemical etching treatment increases light diffusivity, because the changes in the surface geometry, e.g., scallops, plateaus with protrusions, pits, mounds, and/or lands, of the exterior surface S1 of the glass tube body 100 case the light passing through the sidewall of the glass tube body 100 to scatter via the interactions of the beam of light and the multiple faces and/or interfaces of the textured surface, i.e., increase light diffusivity. In some embodiments, a large amount light is scattered by the chemically etched surfaced of the glass sidewall for the glass tube body 100 due to the randomly orientated faces and significantly larger effective surface area for the sidewall that is provided by the chemical etch process when compared to the original glass sidewall prior to etching, which can be characterized as a non-textured surface having a roughness value designating a smooth surface.

Figure 2:
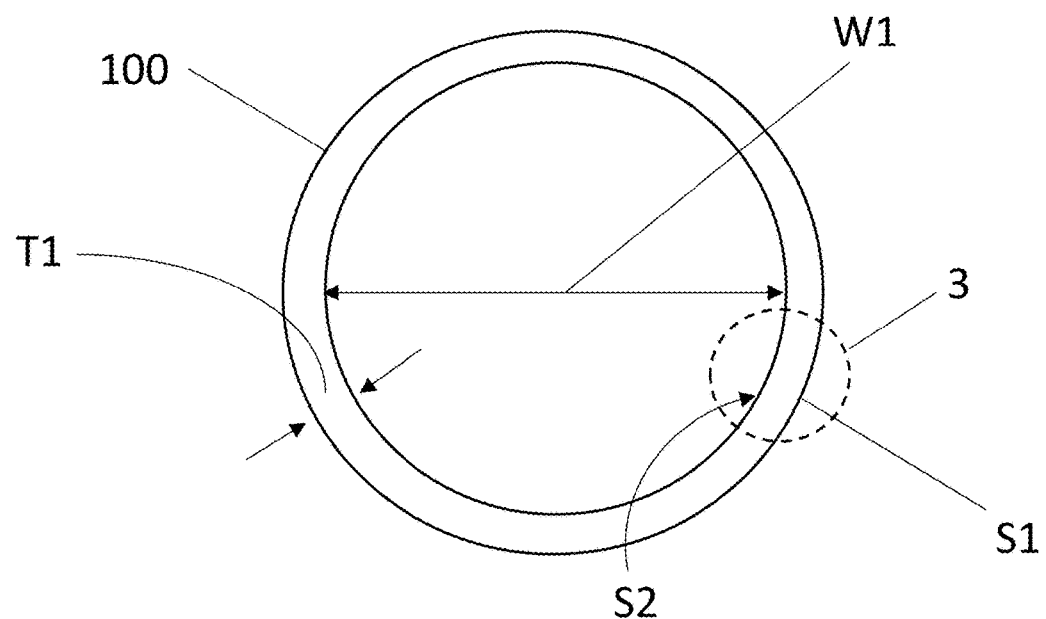
FIG. 2 is a side cross-sectional view of a portion of a glass tube body that is depicted in FIG. 1.

FIGS. 1 and 2 depict a glass tube body 100, in which the exterior surface S1 of and the interior surface S1 of the lamp tube's glass sidewall has been chemically etched to increase each of the surface's, i.e., interior surface S1 and exterior surface S2, roughness, i.e. texture, which increases the light diffusivity of the glass lamp tube 100. The term "glass" denotes the material of the glass tube body 100 is composed of an amorphous solid material. The glass of the glass tube body 100 may be any of various amorphous materials formed from a melt by cooling to rigidity without crystallization, such as a transparent or translucent material composed of a mixture of silicates.

In some embodiments, one type of glass usable for the glass tube body 100 is a "soda-lime" glass. In general, soda-lime glass contains a percentage of sodium oxide and calcium oxide dispersed in silicon dioxide (silica), which forms the major component of the glass. Soda-lime glasses useful for the glass tube body 100 may contain from 5 to 45 percent by weight of soda-lime. In some other embodiments, the soda-lime glass used in the glass tube body 100 may contain from about 20-25 percent by weight soda-lime.

In some embodiments, the glass composition used for the glass tube body 100 is a soda lime silicate glass. In one example, the glass composition for the soda lime silicate glass that provides the glass of the glass tube body 100 contains 60-75% silica, 12-18% soda, and 5-12% lime.

In some other examples, the glass composition used for the glass tube body 100 may be a borosilicate glass. Borosilicate glass is a silicate glass having at least 5% of boric oxide in its composition. It is noted that the above glass compositions are provided for illustrative purposes only, and are not intended to limit the glass tube body 100 to only the compositions that are described above, as any glass composition is suitable for use with the glass tube body 100. For example, glasses containing potassium oxides, barium oxides, strontium oxides and aluminum oxides, with or without a small percentage of lead, may also be used for the composition of the glass tube body 100. In other examples, the glass composition may include alkaline earth aluminosilicate, alkali aluminosilicate glass, an alkali borosilicate glass, a boroaluminosilicate glass or a combination thereof. The glass tube body 100 does not include polymeric or plastic compositions.

Referring to FIGS. 1-2, in some embodiments, the glass tube body 100 has a cross-sectional geometry that is perpendicular to a length L1 of the glass tube body 100 with a substantially cylindrical perimeter defined by a sidewall of the glass tube body 100 enclosing a hollow interior for housing a light source, e.g., light emitting diode (LED) light source. The length L1 of the glass tube body 100 extends from a first end E1 of the glass tube body 100 for engagement by a first end cap 300 to a second end E2 of the glass tube body 100 for engagement of a second end cap 300. The length L1 of glass tube body 100 is greater than a width W1 (diameter) of the glass tube body 100. In some embodiments, the length L1 of the glass tube body 100 may range from 5" to 100", and the width W1, i.e., diameter, of the glass tube body 100 may range from 0.5" to 2.0". In one embodiment, the thickness T1 of the glass sidewall for the glass tube body 100 may range from 0.5 mm to 1.1 mm. It is noted that this example for the thickness T1 of the glass sidewall is only one example, and is not intended to be limiting. For example, the thickness T1 of the sidewall of the glass tube body 100 may be thicker to withstand more aggressive chemical etching methods.

The dimensions, i.e., length L1 and width W1, of the glass tube body 100 may be selected to be consistent with the standard sizes of T5, T8 and T12 fluorescent type lamps. For example, the length L1 and width W1 of the glass tube body 100 may be selected to be consistent with the T5 standard for fluorescent type lamps. In this example, the glass tube body 100 can have a width W1 (diameter) that is ⅝", i.e., 0.625", and a length L1 that can be 12", 24", 36", 48" or 60". In another example, the length L1 and width W1 of the glass tube body 100 may be selected to be consistent with the T8 standard for fluorescent type lamps. In this example, the glass tube body 100 can have a width W1 (diameter) that is 8/8", i.e., 1.0", and a length L1 that can be 12", 24", 36", 48" or 60". In yet another example, the length L1 and width W1 of the glass tube body 100 may be selected to be consistent with the T12 standard for fluorescent type lamps. In this example, the glass tube body 100 can have a width W1 (diameter) that is 12/8", i.e., 1.5", and a length L1 that can be 12", 24", 36", 48" or 60".

The width dimension W1 for the hollow interior of the glass tube body 100 is selected so that the width of the hollow interior is sufficient for housing a light source, such as surface mount device (SMD) light emitting diodes (LEDs) present upon a light emitting diode (LED) board, such as a circuit board, e.g., printed circuit board The exterior surface S1 of the sidewall of the glass tube body 100 is textured to provide a roughness that increases the light diffusivity performance of the glass tube body 100. The self-diffusive tubular glass is provided by a chemical etching surface treatment applied to the glass sidewall, e.g., exterior surface S1 of the glass sidewall, and interior surface S2 of the glass sidewall, of the glass tube body 100. The chemical etching surface treatment can form contiguous areas of glass that have been differentially etched to provide recesses, e.g., pits, or high elevation domains, e.g., mounds, plateaus or lands. The chemical etching surface treatment provides a textured surface S1 that increases the roughness of the exterior surface S1 and the interior surface S2 of the glass tube sidewall, which in turn increases the light diffusivity performance of the glass tube body 100. The increase in light diffusivity results from increasing the faces of the textured surfaces, i.e., by changes in direction and variations in height, as well as the increased interfaces of the faces of the textured surfaces.

FIG. 3 is a magnified view of a portion of a glass tube body 100 sidewall depicted in FIG. 2 that is identified by reference number 3. FIG. 3 further illustrates a cross section of a chemically etched glass sidewall for the glass tube body 100, in which the interior surface S2 of the glass sidewall has been textured, and that the exterior surface S1 of the glass sidewall has been textured. The exterior surface S1 depicted in FIG. 3 is textured to provide a roughness that results from a plurality of scallops, i.e., features having peaks, and pits, i.e., features having troughs, in which the roughness of the texture is sufficient to scatter light. In some embodiments, the scallops 4 may have a parabolic-like shape. In other embodiments, the scallops 4 may be defined by a peaked structure, i.e., having an apex at an upper surface, in which the sidewalk of each scallop 4 may have a convex or a concave curvature. For example, the scallops 4 that are depicted in FIG. 3 have sidewalls S3, S4 extending from the apex A1 of the scallop that are concave relative to the center of the scallops 4 cross-section. In other embodiments, the sidewalk S3, S4 extending from the apex A1 of the scallops 4 may be convex.

Referring to FIGS. 3 and 4, the interior surface S2 of the glass sidewall, and the exterior surface S3 of the glass sidewall has been etched to produce scallops 3 with islands 4 distributed thereover. The texture of the interior surface S2 of the glass sidewall is the same as the texture of the exterior sidewall S1 of the glass sidewall for the glass tube body 100. This can result from the chemical etchant being applied to the interior surfaces S2 and the exterior surfaces S1 of the glass sidewall of the glass tube body 100 substantially simultaneously, as part of an immersion treatment, in which the glass tube body 100 can be immersed within chemical etchant, so that the same chemical etchant is in contact with both the interior surface S2 and the exterior surface S1 simultaneously during the duration of the etching process. This provides that the exterior sidewall S1 and the interior sidewall S2 can have the same texture, and therefore, can be characterized as having the same roughness. For example, texture on exterior surface S1 has a first roughness comparable, e.g., substantially equal, to the texture on the interior surface S2 having a second roughness, the first roughness and the second roughness being the same value. "Roughness," "surface roughness (Ra)," or like terms refer to, on a microscopic level or below, an uneven or irregular surface condition, such as an average root mean squared (RMS) roughness or RMS roughness described below.

In some embodiments, the glass scallops 4 that are present on the interior surface S2 and the exterior surface S1 can form a somewhat wavy structure, as depicted in FIG. 3, with the scallops 4 having a diameter ranging from about 100 micrometers to about 2000 micrometers and an average depth measured from the lowest depression point to maximum elevation of between 1 micrometer and 50 micrometers. In another embodiment, the scallops 4 have an average depth ranging from 5 micrometers to 30 micrometers. In one embodiment, the scallops 4 may have a height of 20 microns. In one embodiment, the scallops 4 are uniformly distributed over both the interior surface S2 of the glass sidewall of the glass tube body 100, and the exterior surface S1 of the glass sidewall of the glass tube body 100.

Referring to FIG. 4, in some embodiments, the texture that provides the roughness for the exterior surface S1 and the interior surface S2 of glass sidewall of the glass tube body 100 can include a plurality of discrete spaced-apart plateaus 7 including a plurality of projections 8, can be randomly distributed over the glass surface. In some embodiments, the plateaus have a diameter that can range from about 10 micrometers to 150 micrometers. In some embodiments, each of the projections 8 may have an inverted v-shaped side cross-sectional geometry. The upper surface of the projection is provided by the apex A1 of the inverted v-shaped geometry. In some embodiments, the chemically etched surfaces S1, S2 may be textured to provide plateaus 7 without the projections 8. In some embodiments, to provide light diffusivity that can reduce hot spot lighting characteristics in LED tube lamps, the plurality of plateaus 7 may be present in numbers ranging from 10 plateaus per square millimeter and 600 plateaus per square millimeter. In some embodiments, to provide light diffusivity that can reduce hot spot lighting characteristics in LED tube lamps, the plurality of plateaus 7 may be present in numbers ranging from 50 plateaus per square millimeter and 100 plateaus per square millimeter.

In addition to producing a scalloped surface 4, as depicted in FIG. 3, and/or the plurality of islands 7, the chemically etching treatment may also produce a fine porous structure on the interior surface S2 and the interior surface S1 of the glass sidewall of the glass tube body 100. In some other embodiments, the texture produced by the chemical etching process applied to the glass tube body 100 that provides the roughness for the exterior surface S1 and the interior surface S2 for the glass sidewall of the glass tube body 100 that increases light diffusivity may be further characterized as topological or morphological features, such as, projections, protrusions, depressions, pits, closed or open cell structures, particles, islands, lands, trenches, fissures, crevices, micro fractures, scallops and like geometries and features, or combinations thereof.

It is noted that the concentration and size of the topographic texture features may be uniform along the entire surface, i.e., along an entirety of the perimeter and/or along an entirety of the length L1, of the textured exterior surface S1 and the textured interior surface S2 of the glass tube body 100. The textured surface that is formed on the exterior surface S1 and interior surface S2 of the sidewall of the glass tube body 100 may cover the entirety of the surfaces S1, S2, i.e., present on the entirety of the perimeter and length L1 of the glass tube body 100.

In one example, the exterior surface S1 of the glass sidewall that is textured has a first roughness with a root mean square (RMS) roughness greater than 700 nm and smaller than 10 microns. In some embodiments, the RMS roughness of the outer surface of the glass tube body 100 is greater than 700 nm and smaller than 10 microns. It is noted that the aforementioned embodiments are only some examples of the RMS roughness for the exterior surface S1 of the sidewall of the glass tube body 100. For example, the textured surface for the exterior surface S1 of the sidewall of the glass tube body 100 can have a first roughness with an average RMS roughness in the ranges of 10 nm, 25 nm, 50 nm, 100 nm, 200 nm, 300 nm, 400 nm, 500 nm, 600 nm, 700 nm, 800 nm, 900 nm, 1 micron, 1.25 microns 1.5 microns, 1.75 microns and 2.0 microns, as well as any range of values for the RMS roughness including one of the aforementioned values for the lower limit of the range, and one of the aforementioned values for the upper limit of the range, as well as any value within ranges using the above examples for upper and lower limits.

In one example, the interior surface S2 of the glass sidewall that is textured has a second roughness with a root mean square (RMS) roughness greater than 700 nm and smaller than 10 microns. In some embodiments, the RMS roughness of the inner surface S1 of the glass panel is greater than 700 nm and smaller than 10 microns. It is noted that the aforementioned embodiments are only some examples of the RMS roughness for the interior surface S2 of the sidewall of the glass tube body 100. For example, the textured surface for the interior surface S2 of the sidewall of the glass tube body 100 can have a second roughness with an average RMS roughness in the ranges of 10 nm, 25 nm, 50 nm, 100 nm, 200 nm, 300 nm, 400 nm, 500 nm, 600 nm, 700 nm, 800 nm, 900 nm, 1 micron, 1.25 microns 1.5 microns, 1.75 microns and 2.0 microns, as well as any range of values for the RMS roughness including one of the aforementioned values for the lower limit of the range, and one of the aforementioned values for the upper limit of the range, as well as any value within ranges using the above examples for upper and lower limits.

The first roughness of the exterior surface S1 is comparable to, or substantially close to, the second roughness of the interior surface S2.

Referring to FIGS. 1-4, a glass tube body 100 is provided of self-diffusive tubular glass, in which the roughness of the textured exterior surface S1 and the textures interior surface S2 of the glass sidewall provides light diffusivity performance that allows for the glass tube body 100 to house a plurality of light emitting diodes (LEDS), as a light source within the hollow interior of the glass tube body 100, wherein illumination of the LEDs within the glass tube body 100 does not result in hot spot patterning. "Hot spot patterning" occurs when the light diffusivity performance of the glass is insufficient, and instead of the point light sources provided by the LEDs providing light in a uniform representation, the point light sources when illuminated are visually perceived individually, i.e., as spots of light. The roughness of the texture of the exterior surface S1 provides for light scattering, which increases light diffusivity.

In some embodiments, the glass tube body 100 has a scatter ratio of 0.5 or more for visible wavelengths between 400 nm and 700 nm. In some other embodiments, the glass tube body 100 has a scatter ratio of 0.75 or more for visible wavelengths between 400 nm and 700 nm. In further embodiments, the glass tube body 100 has a scatter ratio of 0.80 or more for visible wavelengths between 400 nm and 700 nm. In yet another embodiment, the glass panel has a scatter ratio of 0.85 or more for visible wavelengths between 400 and 700 nm. In an even further embodiment, the glass tube body 100 has a scatter ratio of 0.90 or more for visible wavelengths between 400 nm and 700 nm. In yet a further embodiment, the glass tube body 100 has a scatter ratio of 0.95 or more for visible wavelengths between 400 and 700 nm.

Figure 5:
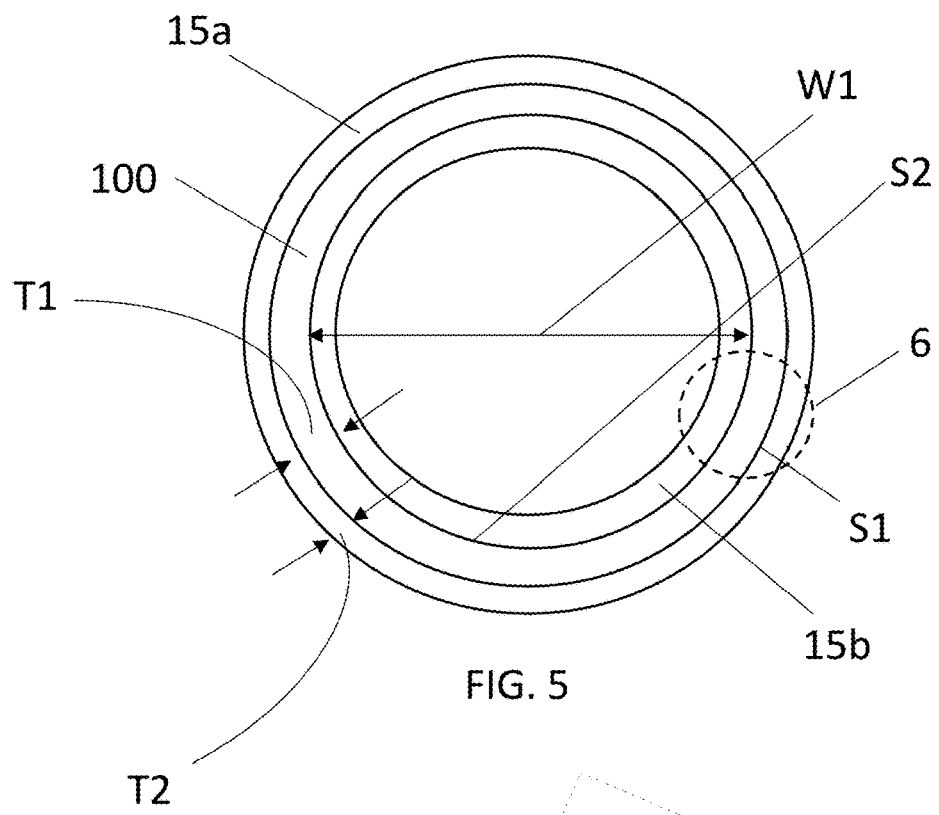
FIG. 5 is a side cross-sectional view of a portion of a glass tube body having an exterior sidewall surface that has been textured using an etch treatment, i.e., chemical etch, in which the textured surface is coated with a low refractive index coating, in accordance with one embodiment of the present disclosure.
Figure 6:
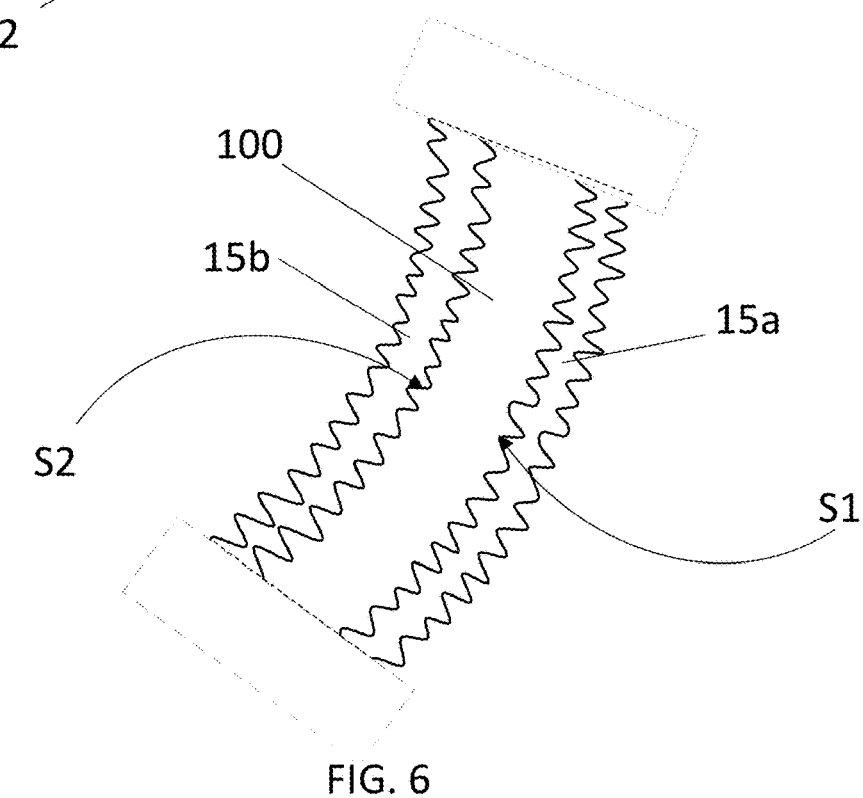
FIG. 6 is a magnified side cross-sectional view of a portion of a glass tube body sidewall depicted in FIG. 5, in which the textured surface is coated with a low refractive index coating.

FIGS. 5 and 6 depict one embodiment of a glass tube body 100 having an exterior surface S1 and interior surface S2 that has been textured using a chemical etching surface treatment, in which the textured surfaces S1, S2 are coated with a low refractive index coating 15a, 15b. The term "low refractive index coating" may denote a coating having a refractive index that ranges from 1.1 to 1.5. The low refractive index coating 15 is applied to increase the light transmittance of the glass tube body 100. The low refractive index coating 15a, 15b may also be referred to as an anti-reflective coating. The glass tube body 100 that is depicted in FIGS. 5 and 6 has been described above with reference to FIGS. 1-4. The low refractive index coating material can be applied to the chemically etched glass tube by using spray coating, dip coating, and or spin coating. Spinning process can be used independently or in addition to the spray or dip coating to achieve controlled coating thickness and uniformity.

FIG. 6 is a magnified side cross-sectional view of a portion of a glass tube body sidewall depicted in FIG. 5 that is identified by reference number 6. FIG. 6 further illustrates the low refractive index coating 15a being present on the exterior surface S2 of the glass sidewall of the glass tube body 100, and the low refractive index coating 15b being present on the interior surface S1 of the glass sidewall of the glass tube body 100. In some embodiments, the low refractive index coating 15a, 15b may have a conformal thickness so that the exterior surface of the low reflective index coating 15a, 15b matches the deposition surface, e.g., texture of the interior surface S2 or exterior surface S1 of the glass tube body 100, on which the low refractive index coating 15a, 15b is deposited.

In some embodiments, by applying the low refractive index coating 15a, 15b to the chemically etched glass tube body 100, the optical transmittance is improved from the original level of less than 85% to the improved level above 90%.

In some embodiments, the low refractive index coating 15 can be prepared from fluorinated polymers. The refractive index of a fluorinated polymer correlates with the amount of fluorine in the polymer. Increasing the fluorine content in the polymer decreases the refractive index of the polymer.

Fluoroelastomers suitable for use as the low refractive index coating 15 can include fluoroelastomers composed of copolymerized units of one or more monomers containing fluorine, such as vinylidene fluoride, hexafluoropropylene, 1-hydropentafluoropropylene, 2-hydropentafluoropropylene, tetrafluoroethylene, chlorotrifluoroethylene, and perfluoro(alkyl vinyl ether), as well as other monomers not containing fluorine, such as ethylene, and propylene. The polymers may be prepared by polymerization of the appropriate monomer mixtures with the aid of a free radical generating initiator either in bulk, in solution in an inert solvent, in aqueous emulsion or in aqueous suspension. The polymerizations may be carried out in continuous, batch, or in semi-batch processes.

Specific examples of such fluoroelastomers suitable for use as the low refractive index coating 15a, 15b can include, but are not limited to copolymers of vinylidene fluoride and hexafluoropropylene and, optionally, tetrafluoroethylene; copolymers of vinylidene fluoride, hexafluoropropylene, tetrafluoroethylene and chlorotrifluoroethylene; copolymers of vinylidene fluoride and a perfluoro(alkyl vinyl ether) and, optionally, tetrafluoroethylene; copolymers of tetrafluoroethylene and propylene and, optionally, vinylidene fluoride; and copolymers of tetrafluoroethylene and perfluoro(alkyl vinyl ether), preferably perfluoro(methyl vinyl ether). Each of the fluoroelastomers of the composition of the low refractive index coating 15a, 15b can also include at least one halogenated cure site or a reactive double bond resulting from the presence of a copolymerized unit of a non-conjugated diene. The halogenated cure sites may be copolymerized cure site monomers or halogen atoms that are present at terminal positions of the fluoroelastomer polymer chains. The cure site monomers, reactive double bonds or halogenated end groups are capable of reacting to form crosslinks. The cure site monomers are selected from the group consisting of brominated, chlorinated, and iodinated olefins; and brominated, chlorinated, and iodinated unsaturated ethers and non-conjugated dienes.

The brominated cure site monomers may contain other halogens, preferably fluorine. Examples are bromotrifluoroethylene, 4-bromo-3,3,4,4-tetrafluorobutene-1 and others such as vinyl bromide, 1-bronco-2,2-difluoroethylene, perfluoroallyl bromide, 4-bromo-1,1,2-trifluorobutene, 4-bromo-1,1,3,3,4,4,-hexafluorobutene, 4-bromo-3-chloro-1,1,3,4,4-pentafluorobutene, 6-bromo-5,5,6,6-tetrafluorohexene, 4-bromoperfluorobutene-1 and 3,3-difluoroallyl bromide. Brominated unsaturated ether cure site monomers useful in the invention include ethers such as 2-bromoperfluoroethyl perfluorovinyl ether and fluorinated compounds of the class $CF_2Br$—Rf—O—$CF$=$CF_2$, such as $CF_2BrCF_2CF$=$CF_2$, and fluorovinyl ethers of the class ROCF=CFBr or ROCBr=$CF_2$, where R is a lower alkyl group or fluoroalkyl group, such as $CH_3OCF$=CFBr or $CF_3CH_2OCF$=CFBr.

Iodinated olefins may also be used as cure site monomers. Suitable iodinated monomers include iodinated olefins of the formula: CHR=CH—Z—CH$_2$CHR—I, wherein R is —H or —CH$_3$; Z is a C1-C18(per)fluoroalkylene radical, linear or branched, optionally containing one or more ether oxygen atoms, or a (per)fluoropolyoxyalkylene radical. Other examples of useful iodinated cure site monomers are unsaturated ethers of the formula: I(CH$_2$CF$_2$CF$_2$)$_n$OCF=CF$_2$ and ICH$_2$CF$_2$O[CF(CF$_3$)CF$_2$O]$_n$CF=CF$_2$, and the like, wherein n=1-3. In addition, suitable iodinated cure site monomers including iodoethylene, 4-iodo-3,3,4,4-tetrafluorobutene-1; 3-chloro 4-iodo-3,4,4-trifluorobutene; 2-iodo-1,1,2,2-tetrafluoro-1-(vinyloxy)ethane; 2-iodo-1-(perfluorovinyloxy)-1, 1,-2,2-tetrafluoroethylene; 1,2,3,3,3-hexafluoro-2-iodo-1-(perfluorovinyloxy)propane; 2-iodoethyl vinyl ether; 3,3,4, 5,5,5-hexafluoro-4-iodopentene; and iodotrifluoroethylene.

Examples of non-conjugated diene cure site monomers include 1,4-pentadiene, 1,5-hexadiene, 1,7-octadiene and others. A suitable triene is 8-methyl-4-ethylidene-1,7-octadiene.

Of the cure site monomers listed above, preferred compounds include 4-bromo-3,3,4,4-tetrafluorobutene-1,4-iodo-3,3,4,4-tetrafluorobutene-1, and bromotrifluoroethylene.

Additionally, or alternatively, iodine atoms, bromine atoms or mixtures thereof may be present at the fluoroelastomer polymer chain ends for the fluoropolymer of the low refractive index coating 15a, 15b as a result of the use of chain transfer or molecular weight regulating agents during preparation of the fluoroelastomers. Such agents include iodine-containing compounds that result in bound iodine at one or both ends of the polymer molecules. Methylene iodide; 1,4-diiodoperfluoro-n-butane; and 1,6-diiodo-3,3,4, 4,tetrafluorohexane are representative of such agents. Other iodinated chain transfer agents include 1,3-diiodoperfluoropropane; 1,6-diiodoperfluorohexane; 1,3-diiodo-2-chloroperfluoropropane; 1,2-di(iododifluoromethyl)-perfluorocyclobutane; monoiodoperfluoroethane; monoiodoperfluorobutane; 2-iodo-1-hydroperfluoroethane, etc. Particularly preferred are diiodinated chain transfer agents. Examples of brominated chain transfer agents include 1-bromo-2-iodoperfluoroethane; 1-bromo-3-iodoperfluoropropane; 1-iodo-2-bromo-1,1-difluoroethane and others.

The low refractive index coating 15a, 15b may further include a non-fluorinated multiolefinic cross linking agent. By "non-fluorinated" it is meant that the crosslinking agent contains no covalently bonded fluorine atoms. By "multiolefinic" it is meant that the crosslinking agent contains at least two non-conjugated carbon-carbon double bonds. Typically, the cross-linking agent is present in an amount of 1 to 25 parts by weight per 100 parts by weight elastomer (phr). In some embodiments, the cross-linking agent is present at a level between 1 and 10 phr. The cross-linking, agent has the general formula R(OC(O)CR'=CH2)n where R is linear or branched alkyl, or linear or branched alkyl ether, or aromatic, or aromatic ether, or heterocyclic; and wherein R' is H, or CH3; and wherein n is an integer from 2 to 8. Preferably, the non-fluorinated multiolefinic cross linking agent has the general formula R(CH2CR'=CH2)n where R is linear or branched alkyl, or linear or branched alkyl ether, or aromatic, or aromatic ether, or aromatic ester, or heterocyclic; and wherein R' is H, or CH3; and wherein n is an integer from 2 to 6.

In some embodiments, the low refractive index coating 15a, 15b may contain an organic peroxide typically contain between 1 and 10 phr, and in some embodiments between 5 and 10 phr. Examples of organic peroxides which may be employed in the compositions of the invention include, but are not limited to 1,1-bis(t-butylperoxy)-3,5,5-trimethylcyclohexane; 1,1-bis(t-butylperoxy)cyclohexane; 2,2-bis(t-butylperoxy)octane; n-butyl-4,4-bis(t-butylperoxy)valerate; 2,2-bis(t-butylperoxy)butane; 2,5-dimethylhexane-2,5-dihydroxyperoxide; di-t-butyl peroxide; t-butylcumyl peroxide; dicumyl peroxide; alpha, alpha'-bis(t-butylperoxy-m-isopropyl)benzene; 2,5-dimethyl-2,5-di(t-butylperoxy)hexane; 2,5-dimethyl-2,5-di(t-butylperoxy)hexene-3; benzoyl peroxide, t-butylperoxybenzene; 2,5-dimethyl-2,5-di(benzoylperoxy)-hexane; t-butylperoxymaleic acid; and t-butylperoxyisopropylcarbonate.

It is noted that the above fluoropolymer compositions are provided for illustrative purposes only, and are not intended to limit the present disclosure to only these examples. In one example, the low refractive index coating 15a, 15b is provided by DuPont™ Anti-Reflective (AR) Coating commercially available from DowDupont, Inc.

The low refractive index coating 15a, 15b may be present on an entirety of the textured exterior surface S1 and the entirety of the textured interior surface S1 of the glass tube body 100, i.e., on an entirety of the length and perimeter of the glass tube body 100. In some embodiments, the low refractive index coating 15a, 15b may be present on an entirety of the textured exterior surface S1 and the textured interior surface S2 of the glass tube body., i.e., on an entirety of the length and perimeter of the glass tube body 100. Although the low refractive index coating 15a, 15b is depicted as being present on both the textured interior surface S2 and the textured exterior surface S1, the low refractive index coating 15a, 15b may be omitted from either one of these surfaces S1, S2 or both the textured interior surface S2 and the textured exterior surface S1.

In one embodiment, the thickness T2 of the low refractive index coating 15 may range from 0.1 mm to 1.1 mm. It is noted that this example for the thickness T2 of the low refractive index coating 15 is only one example, and is not intended to be limiting.

In some embodiments, the low refractive index coating 15a, 15b that is applied to the exterior surface S1 and the interior surface S2 of the glass sidewall of the glass tube body 100 can increase the optical transmittance from the original level (in which the low refractive index coating 15a, 15b is not present on the glass tube body 100) of less than 85% to greater than 90%. It is noted that the low refractive index coating 15a, 15b is optional, and may be omitted from the glass tube body 100, the lamp 500 including the glass tube body 100, and the method of forming the lamp 500, as well as the method of forming the glass tube body 100.

Figure 7:
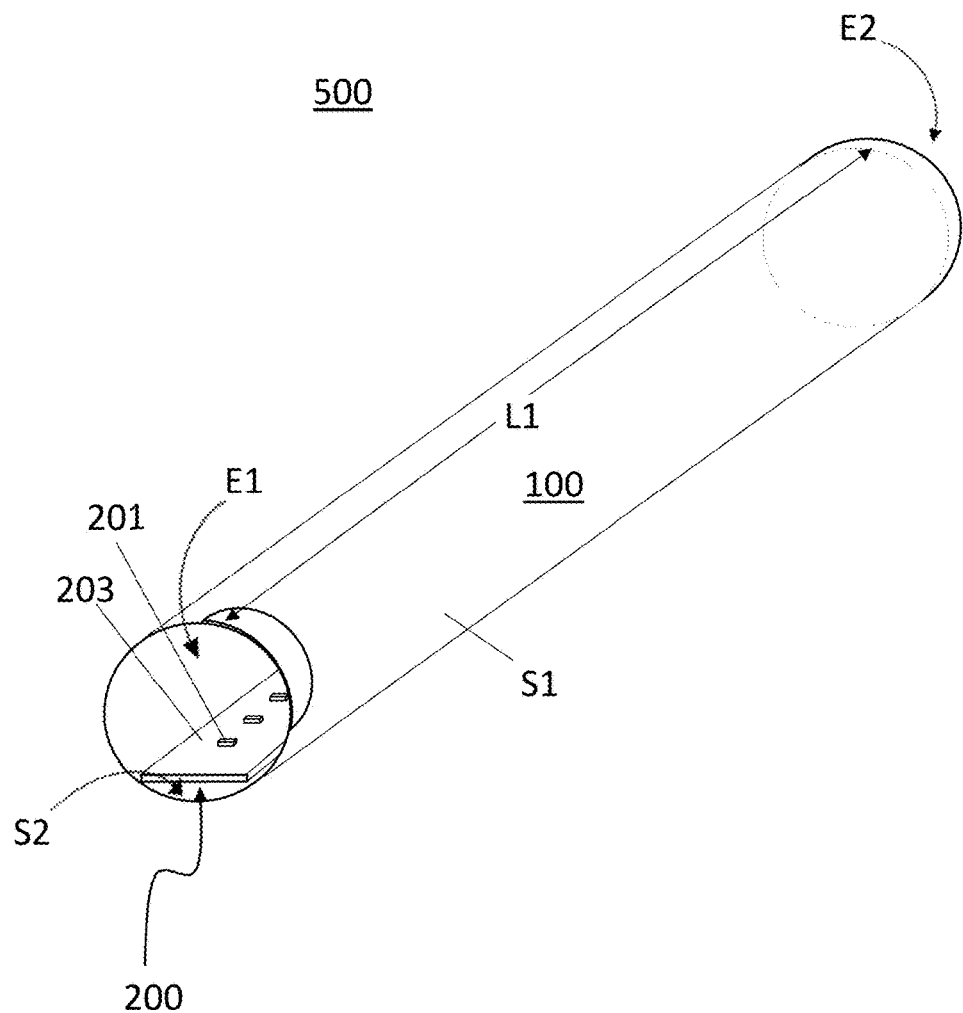
FIG. 7 is a perspective view of a lamp that includes a glass tube body having a glass sidewall that has been chemically etched to increase the surface roughness of the exterior surface and the interior surface of the glass sidewall, in which the end caps are not depicted to illustrate the positioning of the light emitting diode (LED) light source within the interior of the glass tube body, in accordance with one embodiment of the present disclosure.
Figure 8:
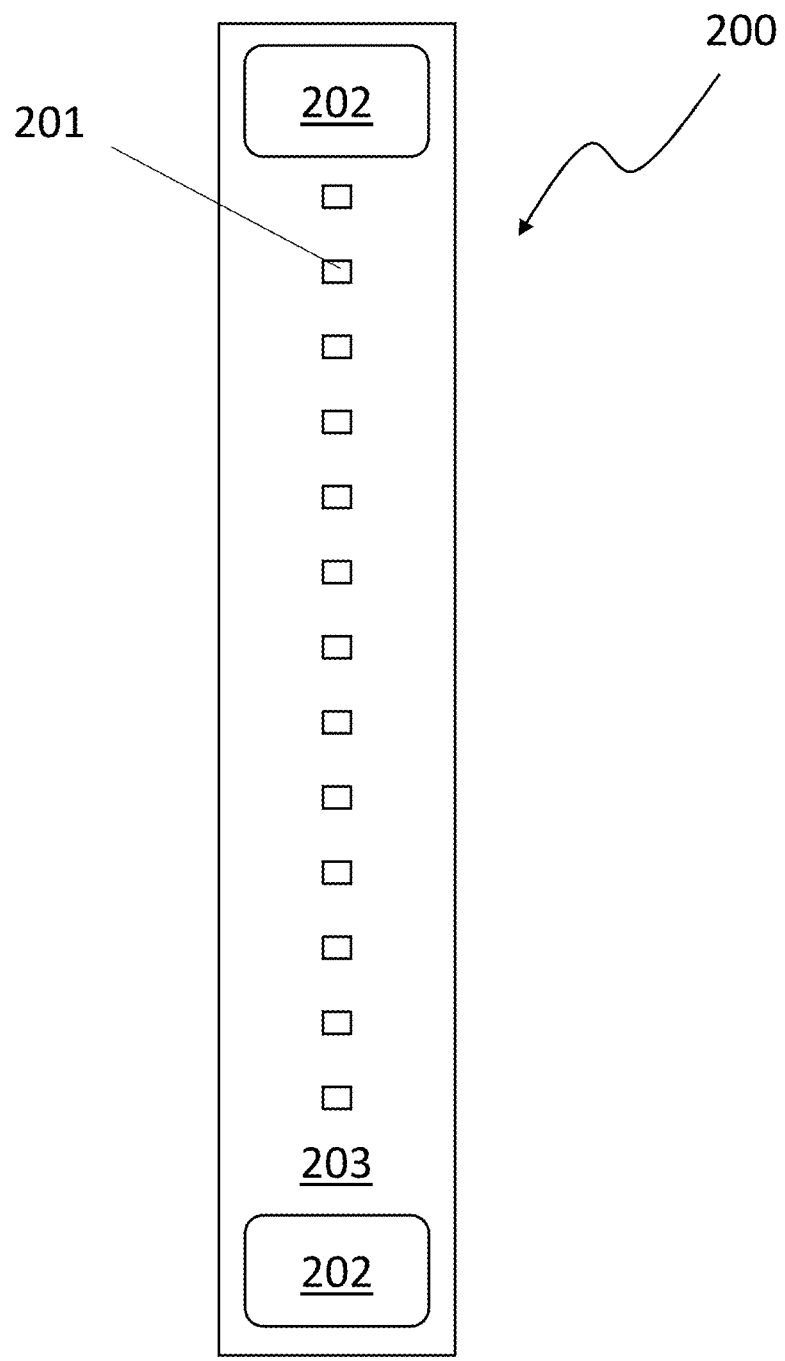
FIG. 8 is a top down view of a light source that can be housed within the glass tube body that is depicted in FIGS. 1-7, in which the light source includes a plurality of surface mount device (SMD) light emitting diode (LED) present on a circuit board, in accordance with at least one embodiment of the present disclosure.
Figure 9:
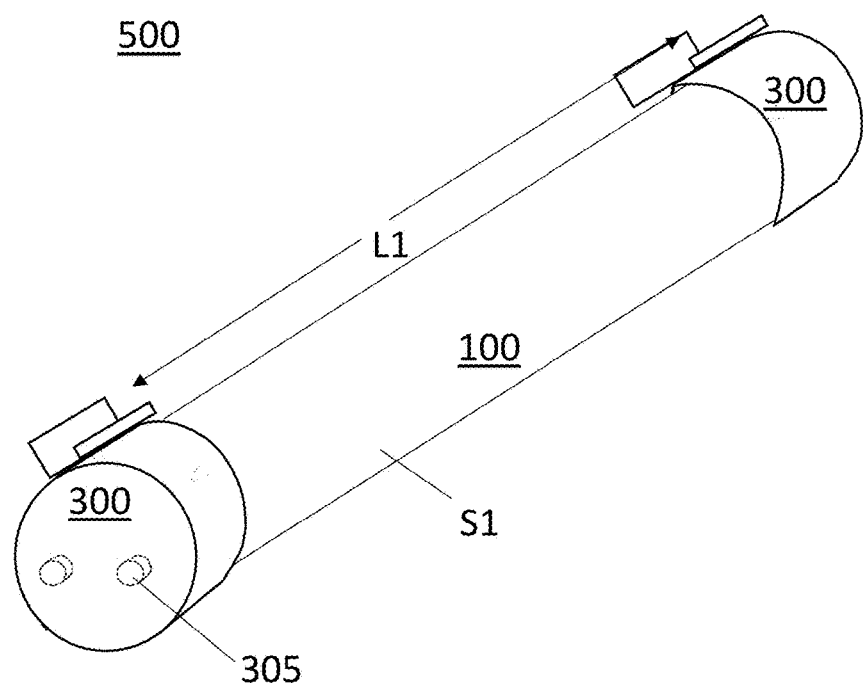
FIG. 9 is a perspective view of an assembled lamp including a glass tube body having a sidewall with an exterior surface that has been textured to increase light diffusivity, a light source housed on a circuit board engaged to the glass tube body within its hollow interior, and end caps at opposing ends of the assembled lamp, in accordance with one embodiment of the present disclosure.

In another aspect, the glass tube body 100 that has been described with reference to FIGS. 1-6 is integrated into a light emitting diode (LED) tube lamp 500, as depicted in FIGS. 7-9. In one embodiment, a lamp 500 is provided that includes a glass tube body 100 having a glass sidewall that has been chemically etched to increase the surface roughness of the glass sidewall, i.e., increase the surface roughness of the interior surface S2 and increase the surface roughness of the exterior surface S1, which increases the light diffusivity of the glass tube body 100. In some embodiments, the lamp 500 provided herein includes a glass tube body 100 having a perimeter defined by a sidewall of the glass tube body 100 for enclosing a hollow interior. The lamp 500 further includes a plurality of light emitting diodes 201 on a substrate 203 that provides the light source 200 that is present within the hollow interior of the glass tube body 100.

Referring to FIGS. 7-9, the glass tube body 100 includes a glass sidewall having surfaces S1, S2 that have been chemically etched to form a textured surface to increase light diffusivity performance of the glass tube body 100. Further details of the glass tube body 100 is provided above in the description of FIGS. 1-6, which provides the description of at least one embodiment of the glass tube body for the lamp 500 that is depicted in FIGS. 7-9. In some embodiments, the textured exterior surface S1 of the glass tube body 100 is coated with an optional low refractive index coating 15a (not depicted), and the textured interior surface S2 is coating with an optional low refractive index coating 15b (not depicted). Further details of the low refractive index coating 15a, 15b is provided above in the description of FIGS. 5-6, which can provide the description of the low refractive index coating 15a, 15b for the lamp depicted in FIGS. 7-9. As noted above, the low refractive index coating 15a, 15b can increase the optical transmittance from the original level (in which the low refractive index coating 15a, 15b is not present on the glass tube body 100) of less than 85% to greater than 90%. Further, the low refractive index coating 15a, 15b may be omitted. Therefore, the lamp 500 that is depicted in FIGS. 7-9 includes some embodiments that include the low refractive coating 15a, 15b, and includes some embodiments that do not include the low refractive coating 15a, 15b.

FIG. 7 depicts a lamp 500 that includes a glass tube body 100 having a glass sidewall that has been chemically etched to increase the surface roughness of the exterior surface S1 and to increase the surface roughness of the interior surface S2 of the glass sidewall, in which end caps 300 are not depicted to illustrate the positioning of the light emitting diode (LED) light source 200 within the interior of the glass tube body 100. The light source 200 can be provided by a light emitting diode (LED) 201 and the substrate 203 can be a circuit board, e.g., printed circuit board (PCB), on which the LEDs 201 are mounted as surface mount devices (SMDs). In addition to semiconductor type light emitting diodes (LEDs), the light source 200 may be organic light emitting diodes, laser diodes or any like light source. Although other light sources and substrates are suitable for use with the glass tube body 100 that is described herein in providing a lamp 500, the light source 200 is specifically referred to hereafter as having light emitting diodes 201, and the substrate 203 is hereafter referred to as a circuit board 203, e.g., printed circuit board.

FIG. 8 depicts one embodiment of a light source 200 that can be housed within the glass tube body 10 that is depicted in FIGS. 1-7, in which the light source 200 includes a plurality of surface mount device (SMD) light emitting diode (LED) 201 present on a circuit board 203. A light emitting diode (LED) 201 is a light source that can be a semiconductor device that emits visible light when an electric current passes through it. The LEDs 201 of the light source 200 can include at least one LED 201, a plurality of series-connected or parallel-connected LEDs 201, or an LED array 201. At least one LED array for the light source 200 can include a plurality of LED arrays. In the embodiment that is depicted in FIG. 8, LEDs 201 may also be arranged in a single column that extends along a majority of the length of the circuit board 203. In some other embodiments, the LEDs 201 can be arranged in multiple columns, e.g., three columns.

Any type of LED may be used in the LEDs 201 of the light source 200. For example, the LEDs 201 of the light source 200 can be semiconductor LEDs, organic light emitting diodes (OLEDs), semiconductor dies that produce light in response to current, light emitting polymers, electroluminescent strips (EL) or the like. The LEDs 201 can be mounted to the circuit board 203 by solder, a snap-fit connection, or other engagement mechanisms. In some examples, the LEDs 201 are provided by a plurality of surface mount discharge (SMD) light emitting diodes (LED) arranged in a plurality of lines on the circuit board 203.

In some embodiments, the LEDs 201 of the light source 200 can produce white light. However, LEDs 201 that produce blue light, purple light, red light, green light, ultra-violet light, near ultra-violet light, or other wavelengths of light can be used in place of white light emitting LEDs 201. In some embodiments, the emission wavelengths for the LEDs 201 of the light source 200 can range from approximately 400 nm to approximately 470 nm, or the emission wavelengths for the LEDs 201 of the light source 200 can range from approximately 300 nm to approximately 400 nm.

The number of LEDs 201 for the light source 200 can be a function of the desired power of the lamp 500 and the power of the LEDs 201. For example, for a 48" lamp 500, the number of LEDs 201 that are present on the circuit board 203 of the light source can vary from about 5 LEDs 201 to about 400 LEDs 201, such that the lamp 500 outputs approximately 500 lumens to approximately 3,000 lumens.

The LEDs 201 for the light source 200 can be mounted on a circuit board 203, such as a printed circuit board (PCB). A printed circuit board (PCB) mechanically supports and electrically connects electronic components, such as the LEDs 201 and the driving electronics 202, using conductive tracks, pads and other features etched from copper sheets laminated onto a non-conductive substrate. The printed circuit board 203 is typically composed of a dielectric material. For example, the circuit board may be composed of fiber-reinforced plastic (FRP) (also called fiber-reinforced polymer, or fiber-reinforced plastic) is a composite material made of a polymer matrix reinforced with fibers. The fibers are usually glass, carbon, aramid, or basalt. The polymer is usually an epoxy, vinylester, or polyester thermosetting plastic, though phenol formaldehyde resins are still in use. In some embodiments, the printed circuit board (PCB) is composed of a composite consistent with the above description that is called FR-4. The printed circuit board 203 may be made in one piece or in longitudinal sections joined by electrical bridge connectors.

Still referring to FIG. 8, the printed circuit board 203 may further include an internal built in regulating electronics, i.e., LED driver 202, and printed circuitry providing electrical communication between the regulating electronics and the LEDs 201, e.g., surface mount discharge (SMD) light emitting diodes (LED). The LED driver 202 is an electrical device which regulates the power to the LED 201, or a string (or strings) of LEDs 201. In some embodiments, the LED driver 202 responds to the changing needs of the LEDs 201, or LED circuit, by providing a constant quantity of power to the LED 201 as its electrical properties change with temperature. In some embodiments, an LED driver 202 is a self-contained power supply which has outputs that are matched to the electrical characteristics of the LED or LEDs 201. In some embodiments, the LED driver 202 may offer dimming by means of pulse width modulation circuits and may have more than one channel for separate control of different LEDs or LED arrays 201. The power level of the LED 201 is maintained constant by the LED driver 202 as the electrical properties change throughout the temperature increases and decreases seen by the LED or LEDs 201. In some embodiments, the supply voltage of the LED driver 202 may be 2.3V to 5.5 V, 2.7V to 5.5 V and/or 3V to 5.5 V. In some embodiments, the output current per channel that can be provided by the LED driver 202 can be between 250 µA and 50 A. In some other embodiments, the LED driver 202 can have an output current per channel ranging from 20 mA to 100 mA, e.g., 25 mA. The LED driver 202 can be present at either end of the printed circuit board 203, or two LEI) drivers 202 may be present on the printed circuit board 203 with one LED driver 202 at each end.

The light source 200 may be engaged to the interior surface S2 of the sidewall of the glass tube body 100 adhesively, or mechanically, e.g., with fasteners. In another embodiment, the light source 200 may be engaged to the interior surface S2 of the sidewall of the glass tube body 100 by figment to ridges (not shown). The retaining ridges having a geometry for engaging a surface of the light source with an apex directed towards the hollow interior, in which the ridges uniformly extend along a majority of the glass tube body 100 length. In another embodiment, the light source may be engaged to the interior surface S2 of the sidewall of the glass tube body by burlings having a geometry for engaging the light source. The burlings are point impressions in the glass tube body 100 providing an apex extending towards the hollow interior of the glass tube body 100.

FIG. 9 depicts one embodiment of an assembled lamp 500 including a glass tube body 100 having a glass sidewall with an exterior surface S1 and an interior surface S2 that have both been textured to increase light diffusivity, a light source 200, e.g., light source provided by a plurality of light emitting diodes (LEDs) 201 housed on a circuit board 203 engaged to the glass tube body 100 within its hollow interior, and end caps 300 at opposing ends of the assembled lamp 500. The end caps 300 have electrical contacts for communication between a lamp fixture and the LED driver 202 of the light source 200, hence providing a lamp 500. In some embodiments, each of the end caps 300 are composed of a polymeric material, such as silicone; a metal material, such as aluminum, or a combination, i.e., assembly, thereof. The end caps 300 have a sidewall having a diameter and geometry that is sufficient to fit over the ends E1, E2 of the glass tube body 100. For example, the majority of the cross-section of the end caps 300 can be substantially circular matching the cross-section of the glass tube body 100. In some embodiments, the end faces of each end cap 300 include a pair of contacts 305 for engagement with a lamp fixture. The contacts 305 are typically composed of a metal, such as aluminum, steel or copper. In some embodiments, the contacts 305 may have a pin type geometry. For example, when the lamp 500 has a geometry for the T4 (13 mm) standard, the contacts 305 may be a pin type contact, in which the pins are separated by 5 mm. In another example, when the lamp 500 has a geometry for the T5 (16 mm) standard, the contacts 305 may be a pin type contact, in which the pins are separated by 5 mm. In yet another example, when the lamp 500 has a geometry for the T8 standard (26 mm), the pins may be separated by a distance of 13 mm. In an even further example, when the lamp 500 has a geometry for the T12 standard (38 mm), the pins may be separated by a distance of 13 mm. The geometry of the contacts 305 is not limited to only pin type geometries. For example, the geometry of the contacts 305 may be provided by peg fittings, single oval fittings, double oval fittings, as well as other contact geometries typically employed in lighting applications.

In some embodiments, wires (not shown) can provide electrical communication between the end caps 300, i.e., the contacts 305 of the end caps 300, to the electrical components of the circuit board 203, such as the electronics driver 202 for the LEDs 201. In some embodiments, the wires are made of metals, and preferably made of copper or steels. Electrical junctions can be provided through mechanical fasteners, such as nut and bolt arrangements, and/or solder like connections.

In another aspect of the present disclosure, a method of assembling a lamp 500 is provided, in which the method includes a sequence can provide the glass tube body 100 that is described with reference to FIGS. 1-6, and can provide the lamp 500 including the glass tube body 100 that is described with reference to FIGS. 7-9. The method of forming the lamp 500 can include a glass tube body 100 having a glass sidewall that has been chemically etched to increase the surface roughness of the exterior surface S1, and to increase the surface roughness of the interior surface S2, of the glass sidewall. Increasing the surface roughness of the exterior surface S1, and increasing the surface roughness of the interior surface S2, of the glass sidewall increases the light diffusivity of the glass tube body 100. In one embodiment, the method of forming the lamp assembly, i.e., lamp 500, includes etching, e.g., chemically etching, a glass tube body 100 to increase a texture of a surface, e.g., interior surface S2 and exterior surface S1, of the glass sidewall of the glass tube body 100, in which the glass sidewall of the glass tube body 100 encloses a hollow interior. In a following step, the method may further include positioning a circuit board 203 including a plurality of light emitting diodes 201 within the hollow interior of the glass tube body 100, wherein the increase in the texture of the surface of the glass tube body 100 increases the light diffusivity of the glass tube body 100. In some embodiments, the method may further include forming an optional low refractive index coating 15a, 15b, on at least one chemically etched surface of the glass sidewall of the glass tube body 100, wherein the low refractive index coating is a fluoropolymer. Following the formation of the glass tube body 100, a light source 200, e.g., circuit board 203 including a plurality of light emitting diodes 201, may then be positioned within the hollow interior of the glass tube body 100. The increase in the texture of the chemically etched surfaces S1, S2 of the glass sidewall of the glass tube body 100, as well as the increase in the roughness in the chemically etched surfaces S1, S2 of the glass sidewall of the glass tube body 100, increases the light diffusivity of the glass tube body 100. Further details of some embodiments of the methods of forming a lamp 500 including a glass tube body 100 having a self-diffusive glass sidewall is provided in the following description of FIGS. 10-15.

Forming the lamp assembly 500 may begin with providing a glass tube body 100. The glass tube body 100 may be provided by a forming process. In some embodiments, the forming process may be a glass drawing used for forming glass tubing, such as the Danner process, updraw, downdraw, Vello process or a combination thereof. In each of these process, raw materials, such as glass composition, e.g., silica containing composition or any of the other glass compositions that have been described above with reference to FIGS. 1-9, such as a soda lime silicate composition, can be fed continuously into one end of a large tank furnace at a rate which balances that at which the molten glass is delivered to forming machines at the other end.

Figure 10:
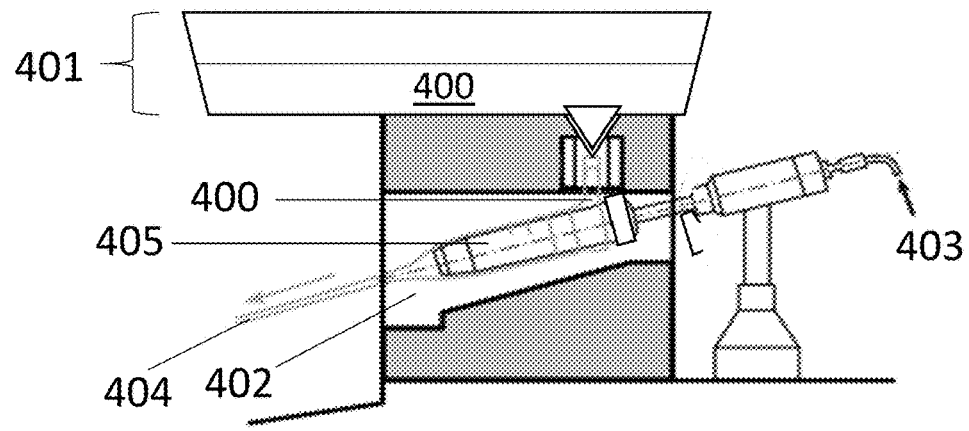
FIG. 10 is a side cross-sectional view of a glass tube forming apparatus for Danner process glass tube formation, in accordance with one embodiment of the present disclosure.
Figure 11:
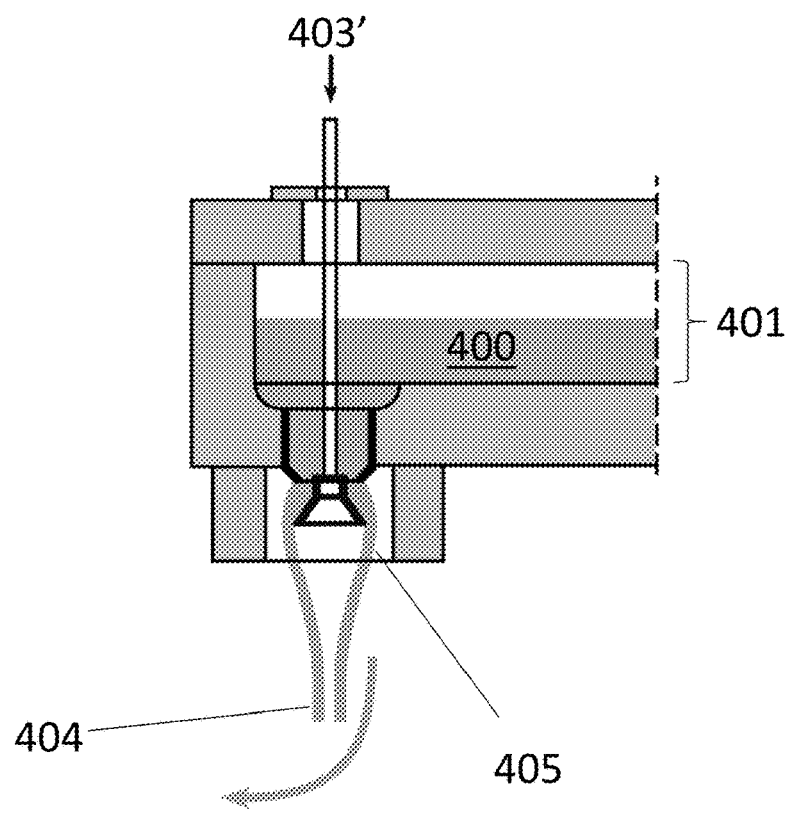
FIG. 11 is a side cross-sectional view of a glass tube forming apparatus for Vello process glass tube formation, in accordance with one embodiment of the present disclosure.

Tubing for glass tube body 100 is continuously drawn from the same type of furnace using either the Danner or the Vello process, which are down draw forming process for forming glass tubing. FIG. 10 depicts one embodiment of a mandrel for glass tube forming using a Danner type drawing process. FIG. 11 depicts one embodiment of a mandrel for glass tube forming using a Vello type drawing process.

In the Danner process, glass 400 flows from the furnace 401 at a controlled rate onto the top of an inclined, hollow refractory mandrel. The glass is in a molten state in the furnace 401 and is received by the mandrel 405 in a molten state. The glass from the forehearth of the furnace is allowed to flow in a ribbon from over a downward-inclined (about 20° from the horizontal), as depicted in FIG. 10. In a downdraw process, the glass flows through a centrally controlled orifice ring and is pulled vertically downwards by a tractor mechanism. In the Vello process, the glass tube is originally drawn vertically, as depicted in FIG. 11, and is then turned horizontally along support rollers.

The geometry of the glass tube 404 being formed by the Danner process and the Vello process for forming tube in accordance with the structures and methods described herein can result from a combination of a mandrel 405 having a geometry that dictates at least a portion of the glass tube exterior, and a blow pipe 403, 403' that introduces air to provide a hollow interior for the glass tube 404.

In the Vello process, the glass 404 in the furnace 401 flows in to a refractory bowl which has an orifice plate in its base (the "ring"). A vertical mandrel 405 is suspended through the ring. Glass is drawn between ring and the mandrel, initially vertically downwards, but then, as it cools, it is pulled through almost 90 degrees by the drawing machine on to the carbon support rollers.

The mandrel 405 of the Danner and/or Vello process may be composed of a metal, such as molybdenum and/or tungsten. The mandrel 405 includes a hollow interior for housing the glass entering the mandrel 405 from the forehearth of the furnace. The mandrel 405 may include a first opening for receiving the glass 404 from the forehearth of the furnace that has a larger diameter than the orifice through which the glass 404 exits the mandrel 405 in a tube form 404. Referring to FIG. 10, in the Danner process, the mandrel 405 can be present in a muffle 402 that can control the temperature of the mandrel 405 as the glass flows within the hollow mandrel 405. The temperature of the glass can range from 600° C. to 1200° C. during the tube forming process. The glass forming temperatures may be similar to both the Danner process and Vello process, as depicted in FIGS. 10 and 11.

The mandrel 405 is rotated in the Danner process, and optionally in the Vello process, to manipulate the glass 400 within the mandrel 405, and to traverse the glass 400 along the length of the mandrel 405 from the glass receiving end of the mandrel 405 to the orifice of the mandrel 405 through which the glass passes in tube 404 form. The continuous rotation of the mandrel 405 also causes the glass to flow downstream of the mandrel 405. The glass ultimately flows off the mandrel 405, where it is picked up, gradually cooled by a cooling station 705 and placed between horizontal tractors 710, as depicted in FIG. 12.

In some embodiments, the viscous nature of the molten glass 400, and the rotational of the mandrels 405 causes the molten glass to pass through the mandrel 405, 405. The molten glass 400 is traversed over the molding surfaces of the mandrel 405. In some embodiments, while the glass 400 is being traversed through the mandrel 405, air is blown down the center of the mandrel 405. The air can be introduced to the mandrel 405 through an air tube 403. The introduction of the air creates the hollow interior of the glass tube 404 for the glass tube body 100.

Figure 12:
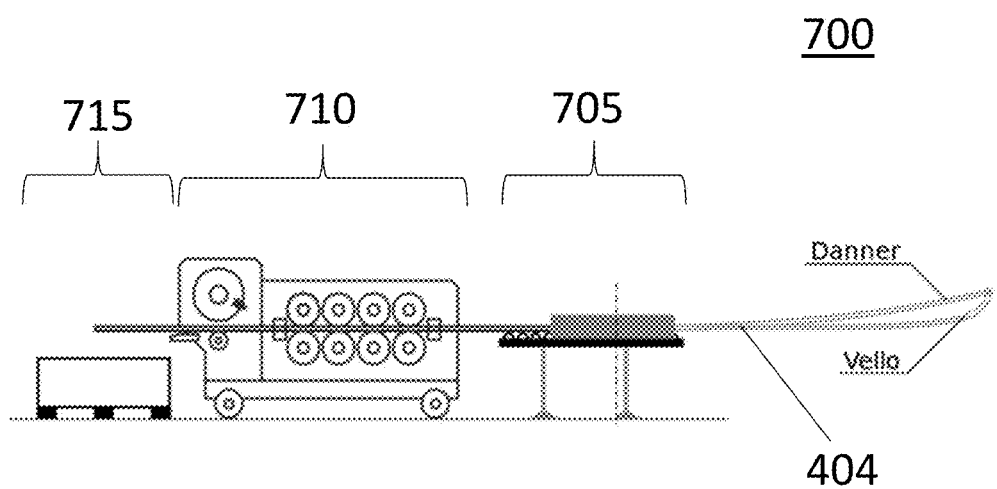
FIG. 12 is a schematic illustrating a production line for vertical tube drawing that can be used with the Vello and Danner type tube drawing methods, in accordance with one embodiment of the present disclosure.

Referring to FIG. 12, the glass tube 404, as it solidifies, is supported between the mandrel 405 and the drawing machine 710 by a series of shaped carbon rollers placed at regular intervals. The size of the tubing drawn depends on the diameter of the mandrel, the draw speed, and the amount of blowing air, the glass temperature and the cooling rate. The cooling rate can be adjusted through a furnace/cooling apparatus 705. The structure identified by reference number 715 represents a take-off machine, which can section the glass tube, i.e., section the glass tube into units that can provide the glass tube body 100 of a lamp 500 including a light emitting diode (LED) light source 200.

It is noted that the above forming methods are provided for illustrative purposes only, and are not intended to limit the present disclosure.

Following formation of the glass tube body 100, the exterior surface S1 of the glass tube body 100 can be treated with a chemical etching treatment to provide a texture having an increased roughness that facilitates light scattering, and therefore improves the light diffusivity performance of the glass tube body 100.

Figure 13:
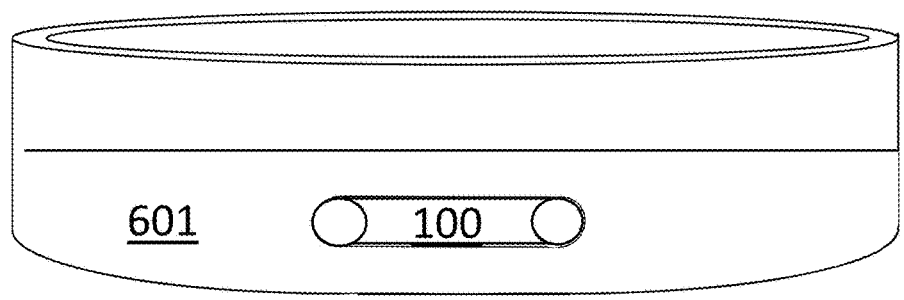
FIG. 13 is a schematic illustrating etching, i.e., chemically etching, the sidewall of a glass tube body, in accordance with one embodiment of the present disclosure.

In some embodiments, the chemical etching may be provided by acid etching, which is done using hexafluorosilicic acid ($H_2SiF_6$). In some embodiments, the hexafluorosilicic acid ($H_2SiF_6$) is prepared by dissolving silica in mixture of hydroelectric acid, quartz power, calcium fluoride and concentrated sulfuric acid derived after heating. In some embodiments, diffusive features can be formed on both sides, i.e., on the interior surface S2 of the glass sidewall of the glass tube body 100, and on the exterior surface S1 of the glass sidewall of the glass tube body 100. FIG. 13 is a schematic illustrating etching, i.e., chemically etching, the sidewall surfaces S1, S2 of a glass tube body 100 by submerging the glass tube body 100 in an etch vat 600 containing the chemical etchant 601, e.g., chemical etchant 601 that includes hexafluorosilicic acid ($H_2SiF_6$). Application of the chemical etchant 601, e.g., hexafluorosilicic acid ($H_2SiF_6$), by submerging the glass tube body 100 within the etch vat 600 containing the chemical etchant 601 can provide that chemical etchant 601 is applied to the interior surfaces S2 and the exterior surfaces S1 of the glass sidewall of the glass tube body 100 substantially simultaneously. In this manner, the same chemical etchant is in contact with both the interior surface S2 and the exterior surface S1 simultaneously during the duration of the etching process. This provides that the exterior sidewall S1 and the interior sidewall S2 can have the same texture, and therefore, can be characterized as having the same roughness. Further details for the etch process may include the following.

It some embodiments, prior to applying the chemical etchant 601, the glass tube body 100 may be cleaned. In some embodiments, the surface S1, S2 of the glass tube body 100 can be cleaned to remove any oils, greases and any other contaminants which may interfere with the etching process. For example, prior to being treated in the chemical etchant 601, the glass tube body 100 may be rinsed with deionized water at room temperature for 1 to 2 minutes with agitation. In other examples, other industrial glass cleansing solutions may be used as a cleansing agent, such as, for example, a 50/50 (volume) solution of ammonia and water. In some examples, the glass to be treated is generally immersed in the cleaning solution at about 45° to about 65° C. to assist the cleaning action, with the solution agitated for a time period ranging from 1 minute to 15 minutes. After removal from the cleansing solution, the glass tube body 100 can then rinsed with clean water, at room temperature, e.g., 20° C. to 25° C.

In some embodiments, once a glass tube body 100 has been cleaned, the chemical etching process may continue with the application of the chemical etchant to the glass sidewalls of the glass tube body 100. Although FIG. 13 illustrates applying the chemical etchant 601 by immersion, the chemical etchant 601 for texturing the glass sidewalls of the glass tube body 100 may also be applied to the glass tube body 100 by selective partial or complete dipping, spaying, immersion, and like treatments, or a combination of the aforementioned treatments.

The chemical etchant 601 may be an acid containing composition, such as hexafluorosilicic acid ($H_2SiF_6$), which is prepared by dissolving silica in mixture of hydroelectric acid, quartz power, calcium fluoride and concentrated sulfuric acid derived after heating. In another embodiment, the chemical etchant 601 may be provided by an acidic etch solution including, for example, 2 to 10 wt % hydrofluoric acid and 2 to 30 wt % of a mineral acid, such as hydrochloric acid, sulfuric acid, nitric acid, phosphoric acid, and like acids, or combinations thereof. Other etch concentrations can be, for example, 3 M HF/3.6 M $H_2SO_4$, 5.5 M HF/6.5 M $H_2SO_4$, 6 M HF/7 M $H_2SO_4$, and like etch compositions and concentrations, including intermediate values and ranges, and compositions.

The glass tube body 100 can be etched in the solution, i.e., chemical etchant 601 contained within the chemical etch vat 600, for time periods of from about 1 second to about 10 minutes, including intermediate values and ranges. The disclosed concentrations and etch times are representative of suitable examples. Concentrations and etch times outside the disclosed ranges can also be used to texture the interior surface S2 and the interior surface S1 of the glass sidewall for the glass tube body 100.

In some embodiments, following texturing of the exterior surface S1 of the glass tube body 100 and the interior surface S2 of the glass tube body 100, an optional low refractive index coating 15a, 15b can be applied to the glass tube body 100 to increase the light transmittance of the glass tube body 100. The low refractive index coating material can be applied to the chemically etched glass tube 100 by using spray coating, dip coating, and or spin coating. Spinning process can also be used independently or in addition to the spray or dip coating to achieve controlled coating thickness and uniformity. In some embodiments, to provide that the low refractive index coating 15a, 15b is applied to both the exterior surface S1 and interior surface S2 of the chemically etched glass tube body 100, the low refractive index coating 15 may be applied using dip coating and/or immersion coating, in which an entirety of the glass tube body 100 may be immersed in the coating during application. The dip coating process is simple, easy to handle, and the double side coating can provide an additional performance merit.

The low refractive index coating 15a, 15b can seal a significant amount of micro fractures that can result from the chemical etching surface treatment, yet, due to the index mismatching, decent amount light scatting is now realized through reflection-transmission. In some embodiments, by applying the low refractive index coating 15a, 15b to the chemically etched glass tube body 100, the optical transmittance is improved from the original level of less than 85% to above 90%. It is noted that the low refractive index coating 15a, 15b may be omitted from the glass tube body 100, as the coating is optional.

Figure 14:
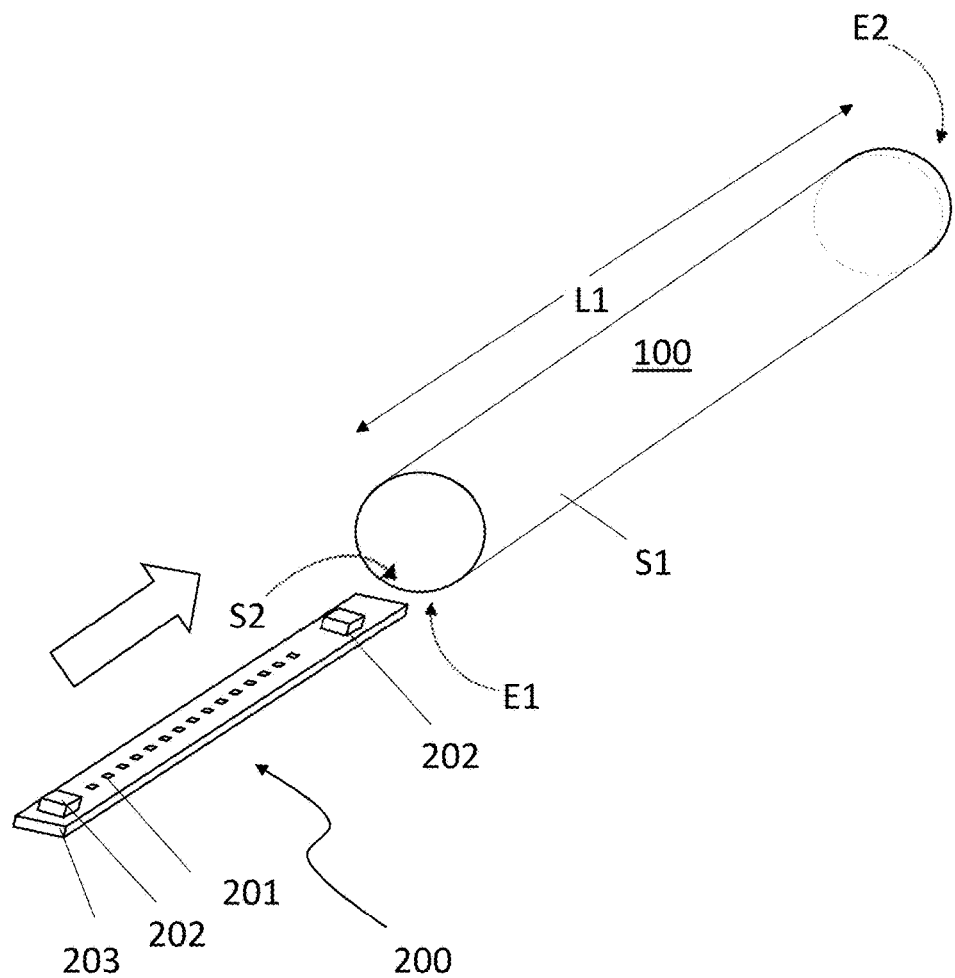
FIG. 14 is a perspective view illustrating sliding a circuit board including at least one light source into a hollow interior of a glass tube body, in accordance with one embodiment of the present disclosure.

FIG. 14 illustrates one embodiment of sliding a circuit board 203 including at least one light source 200 provided by a plurality of light emitting diodes 201 into a hollow interior of a glass tube body 100. The light source 200 may be engaged to the interior surface S2 of the sidewall of the glass tube body 100 adhesively, or mechanically, e.g., with fasteners. In another embodiment, the light source 200 may be engaged to the interior surface S2 of the sidewall of the glass tube body 100 by figment to ridges (not shown). The retaining ridges having a geometry for engaging a surface of the light source with an apex directed towards the hollow interior, in which the ridges uniformly extend along a majority of the glass tube body 100 length. In another embodiment, the light source 200 may be engaged to the interior surface S2 of the sidewall of the glass tube body by burlings having a geometry for engaging the light source. The burlings are point impressions in the glass tube body 100 providing an apex extending towards the hollow interior of the glass tube body 100.

Figure 15:
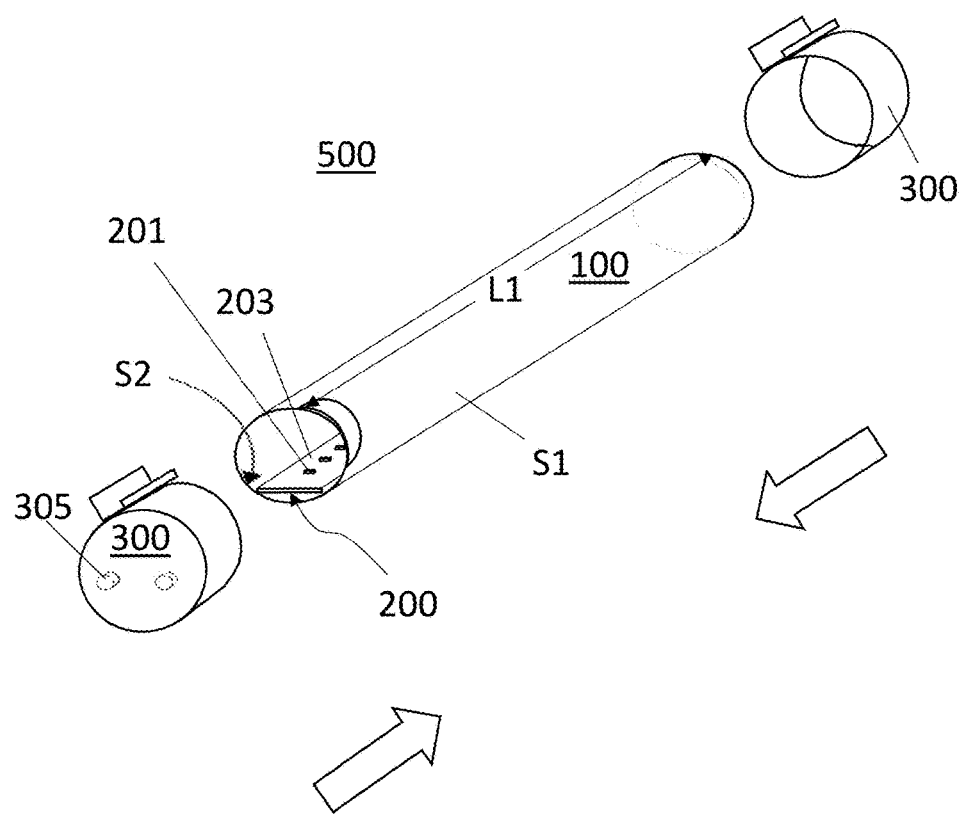
FIG. 15 is a side cross-sectional view depicting installing end caps having electrical contacts for electrical communication with a lamp fixture to the glass tube body that is depicted in FIG. 14, in accordance with one embodiment of the present disclosure.

FIG. 15 depicts installing end caps 300 having electrical contacts 305 for electrical communication with a lamp fixture. The end caps 300 may be positioned on each end E1, E2 of the glass tube body 100, and have electrical contacts for communication between a lamp fixture and the LED driver 202 of the light source 200, hence providing a lamp 500. In some embodiments, wires (not shown) can provide electrical communication between the end caps 300, i.e., the contacts 305 of the end caps 300, to the electrical components of the circuit board 203, such as the electronics driver 202 for the LEDs 201. In some embodiments, the wires are made of metals, and preferably made of copper or steels. Electrical junctions can be provided through mechanical fasteners, such as nut and bolt arrangements, and/or solder like connections.

It is to be appreciated that the use of any of the following "/", "and/or", and "at least one of" for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Spatially relative terms, such as "forward", "back", "left", "right", "clockwise", "counter clockwise", "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS.

Having described preferred embodiments of methods and structures relating to glass tubes for light emitting diodes (LEDs) light source lamps, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A lamp comprising:
   a glass tube body having a perimeter defined by a sidewall of the glass tube body for enclosing a hollow interior, that glass tube body having an exterior surface and an interior surface, in which the exterior surface and the interior surface of the sidewall are textured to increase light diffusivity; and
   at least one light emitting diode (LED) comprising a substrate that provides the light positioned within the hollow interior of the glass tube body.

2. The lamp of claim 1, wherein the substrate is a circuit board having sidewalls engaged to the sidewall of the glass tube body.

3. The lamp of claim 1, wherein said exterior surface has a first roughness that has a root mean square (RMS) roughness greater than 250 nm and smaller than 1.5 microns.

4. The lamp of claim 3, wherein said interior surface has a second roughness that has an root mean square (RMS) roughness greater than 250 nm and smaller than 1.5 microns.

5. The lamp of claim 4, wherein said textured surface on exterior surface having said first roughness is substantially equal to a said texture on said interior surface having said second roughness.

6. The lamp of claim 4, wherein said textured surface that provides at least one of said first roughness and said second roughness includes a plurality of scallops defined by a peaked upper surface and tapered sidewalls extending to a base having a greater width than the peaked upper surface of the scallops.

7. The lamp of claim 4, wherein said texture that provides at least one of said first roughness and said second roughness includes a plurality of plateaus each including surface projections having an inverted v-shaped side cross-sectional geometry, the upper surface of the projection provided by the apex of the inverted v-shape.

* * * * *